United States Patent [19]

Donig

[11] Patent Number: 4,974,916
[45] Date of Patent: Dec. 4, 1990

[54] INTEGRATABLE CIRCUIT ARRANGEMENT FOR DELAYING PULSE-SHAPED SIGNALS

[75] Inventor: Guenter Donig, Ottobrunn, Fed. Rep. of Germany

[73] Assignee: Stim Lab, Inc., Duncan, Okla.

[21] Appl. No.: 434,453

[22] Filed: Nov. 13, 1989

[30] Foreign Application Priority Data

Nov. 29, 1988 [EP] European Pat. Off. ........ 88119914.5

[51] Int. Cl.⁵ .............................................. H03F 3/45
[52] U.S. Cl. .................................... 330/252; 330/256
[58] Field of Search ............... 307/591, 601, 602, 605; 330/252, 256, 257, 261, 307

[56] References Cited

U.S. PATENT DOCUMENTS

4,634,994  1/1987  Wilhelm et al. ................. 330/252 X

OTHER PUBLICATIONS

"Time Delay Circuit For Pulse Signal", IBM Technical Disclosure Bulletin, vol. 30, No. 3, Aug. 1987, pp. 1183-1186.
"Variable Delay Pulse Circuits", by P. T. Marino, IBM Technical Disclosure Bulletin, vol. 16, No. 11, Apr. 1974, pp. 3498-3500.
"Handbuch der digitalen Schaltungen", by Emmo A. Zuiderveen, 2nd ed. 1985, pp. 200-203.

*Primary Examiner*—Steven Mottola
*Attorney, Agent, or Firm*—Bill D. McCarthy; Glen M. Burdick

[57] ABSTRACT

Integratable circuit arrangement for delaying pulse-shaped signals. A differential amplifier circuit is composed of a first current source connected to a zero potential, of an emitter-coupled transistor pair and of two resistors. The two collectors of the transistor pair are respectively connected to the zero potential via a further current source and are connected to one another via a capacitor. A further transistor introduced into both collector lines of the transistor pair delays pulse-shaped signals that are applied at the bases of the transistor pair and the further transistor in a defined allocation to one another, delaying the signals as a function of the current flowing in the coupled emitters of the transistor pair and as a function of the voltage appearing across the capacitor.

28 Claims, 3 Drawing Sheets

INTEGRATABLE CIRCUIT ARRANGEMENT FOR DELAYING PULSE-SHAPED SIGNALS

BACKGROUND OF THE INVENTION

The present invention is directed to an integratable circuit arrangement for delaying pulse-shaped signals.

In pulse technology, it is often necessary to delay signals by a given time span. The distribution of clock signals in larger, fast digital circuits particularly requires compensation for signal running times on signal paths of different lengths. As known, for example, from Emmo A. Zuiderveen, Handbuch der digitalen Schaltungen, 2nd edition 1985, page 200, the transit time compensation is usually carried out with line simulations using passive components or a series-connection of a plurality of gates. Compensation, however, is difficult with the known circuit arrangements since a dimensioning of the passive components is possible only in an extremely limited range or, when gates are used, only whole-numbered multiples of the delay time of a gate are available.

SUMMARY OF THE INVENTION

An object of the present invention is to provide a circuit for delay of a pulse-shaped signal by a given delay time.

This object is achieved by an integratable circuit arrangement having the following basic circuit configuration:

collectors of a first transistor and of a second transistor whose coupled emitters are connected to a zero potential via a first current impression and are connected to one another with a capacitor;

the collector of the first transistor is connected, first, to the zero potential via a second current impression and, second, to an emitter of a third transistor whose collector is connected to a first supply potential via a first resistor;

the collector of the second transistor is connected, first, to the zero potential via a third current impression and, second, to an emitter of a fourth transistor whose collector side is connected to the first supply potential via a second resistor;

a base of the third transistor is provided as a first, non-inverting input, a base of the fourth transistor is provided as a first, inverting input, a base of the second transistor is provided as a second, non-inverting input, and a base of the first transistor is provided as a second, inverting input;

the collector of the fourth transistor is provided as a non-inverting output and the collector of the third transistor is provided as an inverted output; and the differences in potential applied between the two inverting inputs and the differences in potential applied between the two non-inverting inputs are dimensioned such that a saturation of the first and second transistors is avoided.

It is an advantage of the present invention that the delay time can be set over a broad range in a simple manner. Further, it is advantageous that the signal switching edges derive at the output independently of the delay time that is set. Over and above this, a circuit arrangement of the present invention requires no additional recovery time between the change of the output signal and the change of the input signal apart from a minimum running time.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
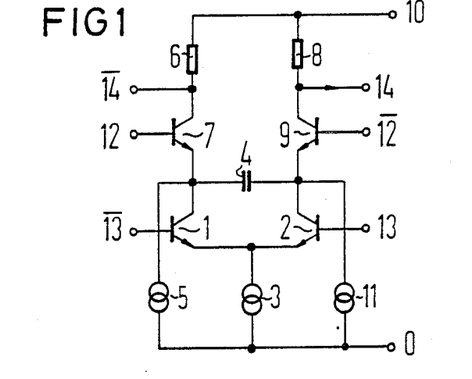
FIG. 1 is a first exemplary embodiment of a circuit arrangement of the present invention.

The exemplary embodiment shown in FIG. 1 has a transistor pair operated in differential amplifier circuitry and composed of a first transistor 1 and of a second transistor 2 whose coupled emitters are connected to a zero potential 0 via a first current source 3 and whose collectors are connected to one another via a capacitor 4. In addition, the collector of the first transistor 1 is connected, first to the zero potential 0 via a second current source 5 and, second, to the emitter of a third transistor 7 that has its collector side connected to a first supply potential 10 via a first resistor 6. Similarly, the collector of the second transistor 2 is connected, first to the zero potential 0 via a third current source 11 and, second, to the emitter of a fourth transistor 9 that has its collector side connected to the first supply potential 10 via a second resistor 8. The base of the third transistor 7 is provided as a first, non-inverting input 12 and the base of the fourth transistor 9 is provided as a first, inverting input $\overline{12}$. Furthermore, the circuit arrangement has a second, inverting input $\overline{13}$ that is formed by the base of the first transistor 1. An inverting output $\overline{14}$ is connected to the collector of the third transistor 7 and a non-inverting output $\overline{14}$ is connected to the collector of the fourth transistor 9. The difference in potential between the two inverting inputs $\overline{12}, \overline{13}$ and between the two non-inverting inputs 12, 13 are dimensioned such that a saturation of the first and second transistors 1, 2 is avoided.

In a development of the present invention, the first and second transistors 1, 2, the third and fourth transistors 7, 9, the second and third current sources, 5, 11, as well as the first and second resistors 6, 8 are each identically constructed to one another, respectively. The advantages of this symmetrical structure is that, first, identical running times thus derive for positive and negative edges of the input signal and that, second, the influence of manufacturing tolerances in the integration of the circuit arrangement is reduced. In the present description the term "current source" is equivalent to the term "means for current impression" or "current impression" which may be a single element or a circuit composed of two or more elements.

Figure 2:
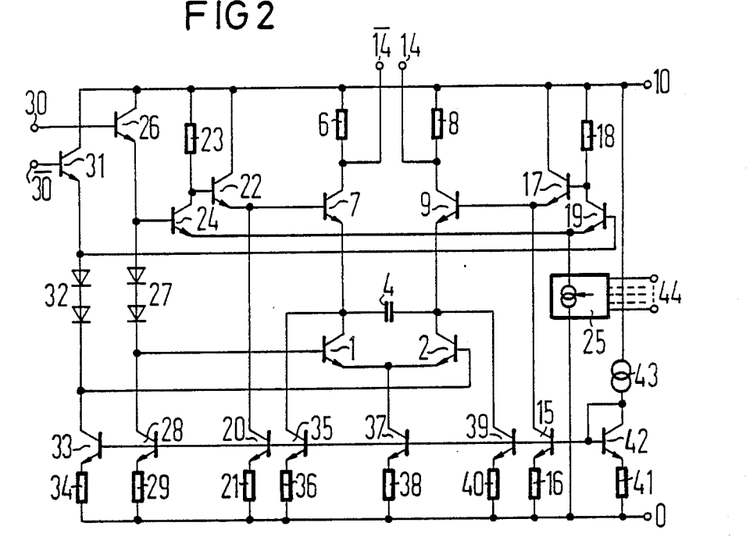
FIG. 2 is a second exemplary embodiment of a circuit arrangement of the present invention.

FIG. 2 shows a development of a circuit arrangement of the present invention which, proceeding from the exemplary embodiment of FIG. 1, is expanded by a drive stage. Identical elements are thereby provided with the same reference numerals. The base of the third transistor 7 forming the first invertor input 12 of the arrangement of FIG. 1 is thereby connected, first, to the zero potential 0 via a fourth current source composed of circuit elements 20, 21, 41, 42, 43 and, second, is connected to the emitter of a fifth transistor 22 that has its collector side connected to the first supply potential 10 and has its base side connected to the collector of a seventh transistor 24 and to the first supply potential 10 via a third resistor 23. Likewise, the base of the fourth transistor 9 that forms the first non-inverting input $\overline{12}$ of the arrangement of FIG. 1 is connected, first, to the zero potential 0 via a fifth current source composed of circuit elements 15, 16, 41, 42, 43 and, second to the emitter of a sixth transistor 17 whose collector side is connected to the first supply potential 10 and whose base side is connected to the collector of an eighth transistor 19 and to the first supply potential 10 via a fourth resistor 18. The coupled emitters of the seventh and eighth transistors 24, 19 are connected to the zero potential 0 via a sixth current source 25. A ninth transistor 26 that has its collector side connected to the first supply potential 10 and whose base is provided as a non-inverting, third input 30 has its emitter side connected to the base of the seventh transistor 24 and to a first terminal of a first serial diode pair 27 in a conducting direction. A second terminal of the first serial diode pair 27, first, is connected to the base of the first transistor 1 and, second, to the zero potential 0 via a seventh current source composed of circuit elements 28, 29, 41, 42, 43. In the same fashion, a tenth transistor 31 that has its collector side connected to the first supply potential 10 and whose base is provided as a third, inverting input $\overline{30}$ has its emitter side connected to the base of the eighth transistor 19 and to a first terminal of a second serial diode pair 32 in a conducting direction. A second terminal of the second serial diode pair 32, first, is connected to the base of the second transistor 2 and, second, to the zero potential 0 via an eighth current source composed of circuit elements 33, 34, 41, 42, 43.

In a development of the present invention, the fifth and sixth transistors 22, 17, the seventh and eighth transistors 24, 19, the ninth and tenth transistors 26, 31, the fourth and fifth current sources composed of circuit elements 20, 21, 15, 16, 41, 42, 43, the seventh and eighth current sources composed of circuit elements 28, 29, 33, 34, 41, 42, 43, the first and second diode pairs 27, 32, as well as the third and fourth transistors 23, 18 are each respectively identically constructed. Again in the advantages of this symmetrical structure is that, first, identical running times thus derive for positive and negative edges of the input signal and that, second, the influence of manufacturing tolerances in the integration of the circuit arrangement is reduced.

In a further development of the present invention, the output stages of a seven-stage current mirror are respectively provided as first, second, third, fourth, fifth, seventh and eighth current sources, this seven-stage current mirror being composed of eleventh, twelfth, thirteenth, fourteenth, fifteenth, sixteenth and seventeenth transistors 33, 28, 20, 35, 37, 39, 15 and of fifth, sixth, seventh, eighth, ninth, tenth and eleventh resistors 34, 29, 21, 36, 38, 40, and 16 as output stages as well as of an eighteenth transistor 42 connected to form a diode and of a twelfth resistor 41 used as an input stage. At its input side, the current mirror is charged with a ninth current source 43. The advantage is that a low number of components is necessary in the execution of the current sources.

In the development of the present invention, a digital-to-analog converter with current output is provided as sixth current source 25, this being digitally derivable via its data lines 44. This yields the advantage that the adjustment of the delay time can be undertaken by a digital arithmetic unit.

Figure 3:
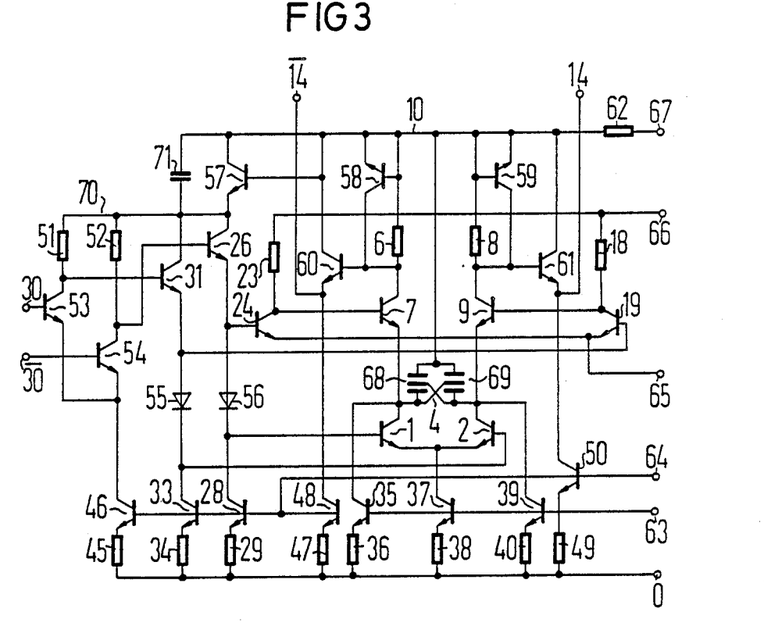
FIG. 3 is a third exemplary embodiment of a circuit arrangement of the present invention.

The exemplary embodiment of FIG. 3 shows the circuit arrangement of FIG. 2 developed to the extent that the capacitor 4 connected between the collectors of the first and second transistors 1, 2 is divided into two sub-capacitors 68, 69 each of which has three plates connected in series. Respectively one outer plate of the sub-capacitors 68, 69 is charged with an auxiliary potential that is equal to the first supply potential 10 in the present exemplary embodiment. The other outer plate of the respective sub-capacitor is connected to the middle plate of the respectively other sub-capacitor. The plates connected to one another are connected to the collector of the first transistor 1 or, respectively, to the collector of the second transistor 2. Such a division of the capacitor 4 is particularly expedient in integrated circuit technology in order to compensate for the influence of parasitic capacitances formed by the substrate. For a discontinuity in potential at the emitter of the third transistor 7 or at the emitter of the fourth transistor 9, the recharging current of the parasitic part of the sub-capacitors 68, 69 is returned from the emitter of the switching transistor to the collector of the third transistor 7 or, respectively, to the collector of the fourth transistor 9 via the plates connected to the auxiliary potential. An identical structure of the two sub-capacitors 68, 69 is expedient in order to guarantee identical electrical properties.

In a further development of the present invention, a respective clamp diode is connected parallel to the first and second resistor 6, 8 in a non-conducting direction. This yields the advantage that potentials that appear at the collectors of the third and fourth transistors 7, 9 and that exceed the first supply potential 10 are limited to the amount of the diode on-state voltage. In the illustrated exemplary embodiment, two inversely operated transistors 58, 59 connected to form diodes are provided as clamp diodes.

In addition, the drive stage depicted in FIG. 2 is also modified in FIG. 3. In a development of the present invention, the base of the third transistor 7 is directly connected to the collector of the seventh transistor 24. Likewise, the base of the fourth transistor 9 is also directly connected to the collector of the eighth transistor 19. The collector of the seventh transistor 24 is connected to a second supply potential 66 via the third resistor 23 and the collector of the eighth transistor 19 is connected to a second supply potential 66 via the fourth resistor 18. The collectors of the ninth and tenth transistors 26, 31 whose emitters are now respectively connected to the eighth current source composed of circuit elements 33, 34 or, respectively, to the seventh current source composed of circuit elements 28, 29 only via a first or, respectively, second diode 55, 56 in a conducting direction and which are charged with a third supply potential 70. Also connected to the third supply potential 70 is a differential amplifier whose inputs are provided as inverting input $\overline{30}$ and as non-inverting 30 of the circuit arrangement and whose outputs are connected to the base of the tenth transistor 31 or, respectively, to the ninth transistor 26. The differential amplifier has two emitter-coupled transistors 53, 54 that are connected to the zero potential 0 at their emitter side via a tenth current source 45, 46, 64 and has two collector resistors 51, 52. By omitting fifth and sixth transistors 22, 27 as well as by replacing the two diode pairs 33, 27 with first and second diodes 55, 56, the advantage derives that the third supply potential 70 can be set lower by the amount of the on-state voltage of a diode.

The third supply potential 70 proceeds from the first supply potential 10 in that both potentials are connected to one another in a conducting direction via a parallel circuit of a further capacitor 71 and of a transistor 57 connected as a further diode. The first supply potential 10 is in turn connected to a fourth supply potential 67 via a drop resistor 62. This yields the advantage that only one main supply potential, namely the fourth supply potential 67, is required for supplying the circuit arrangement since the other supply potentials are internally generated therefrom.

In a development of the present invention, the seventh and eighth transistors 24, 19, the ninth and tenth transistors 26, 31, the eleventh and twelfth transistors 54, 53, the seventh and eighth current sources composed of circuit elements 28, 29, 33, 34, the first and second diodes 55, 56, as well as the third and fourth resistors 23, 18 in the drive circuit of FIG. 3 are each identically constructed, respectively. Over and above this, the differential amplifier composed of circuit elements 45, 46, 51, 52, 53, 54 is also symmetrically constructed.

Also provided as the first, second and third current sources are the three output stages composed of circuit elements 35, 36, 37, 38, 39, 40, respectively, of a three-stage, second current mirror having a first reference voltage source (not shown in detail in FIG. 3) that generates a first reference potential 63 as an input stage, and as the seventh, eighth, tenth current sources are the three output stages composed of circuit elements 28, 29, 33, 34, 45, 46, respectively, of a three-stage, third current mirror having a second reference voltage source (not shown in detail in FIG. 3) that generates a second reference potential 64 as an input stage. Finally, the first, second and third current sources are designed such that the current density in the fourteenth, fifteenth, sixteenth transistors 35, 37, 39 is of the same size. The advantage of the symmetrical structure set forth above as well as of the same current density in the transistors of the output stages of the second current mirror is that, for example, temperature-induced fluctuations of the operating points are compensated.

Also in the development of the present invention, the signals at the inverting and non-inverting outputs $\overline{14}$, 14 in the exemplary embodiment of FIG. 3 are respectively conducted via emitter followers. The two emitter followers are each respectively formed by twenty-second and twenty-third transistors 60, 61 which respectively have their emitter sides charged by further current sources. The further current sources are two further output branches of the third current mirror each having transistors 48, 50 and emitter resistors 47, 49. The connection of the outputs, 14, 14 with emitter followers is advantageous in that feedback from the outputs $\overline{14}$, 14 to the circuit arrangement is accomplished with few circuit elements and simultaneously boosts the output current. To the same degree, however, amplifier circuits for buffering the outputs $\overline{14}$, 14 are also suitable.

The sixth current source 25 shown in FIG. 2 is not executed in greater detail in FIG. 3. Instead, a terminal 65 connected to the coupled emitters of the seventh and eighth transistors 24, 19 is provided for an external current.

The transistors shown in the exemplary embodiments are exclusively npn types. However, it is also correspondingly possible to use pnp types in the same fashion. Over and above this, there is the possibility of also realizing a circuit arrangement of the present invention entirely or partially in MOS technology.

The fundamental structure of the circuit arrangements shown in the figures having been set forth, the operation of the circuit arrangements will now be discussed in greater detail.

Figure 4:
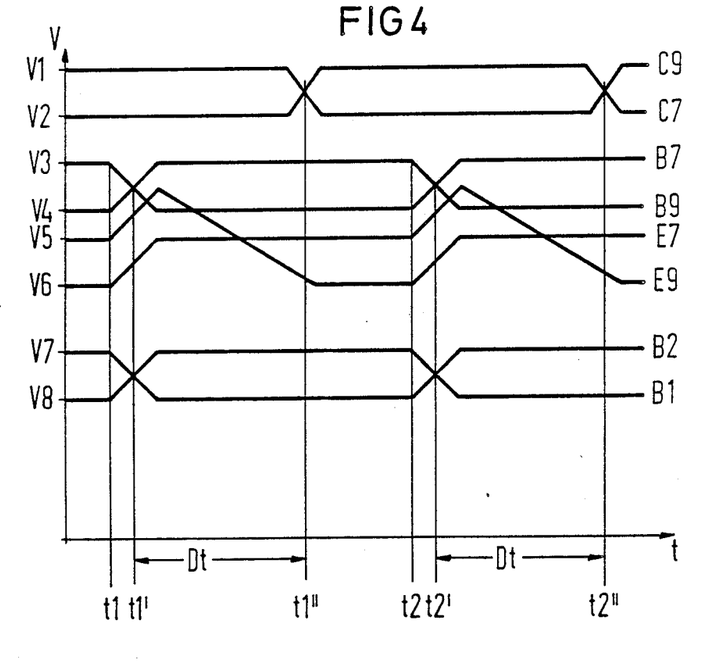
FIG. 4 is a timing diagram of the signal curve of a circuit arrangement of the present invention.

FIG. 4 of the drawings shows the signal curve in a circuit arrangement of the present invention in a diagram, with the potential V shown as a function of time t. A signal B7 to be delayed is applied at the base of the third transistor 7 and the corresponding but inverted signal B9 is applied at the base of the fourth transistor 9. The signal B7 to be delayed initially carries a potential V3 in order to then change to a lower potential V4 at a given, first time t1 and to then return to the potential V3 at a given, second time t2. The potentials at the base of the fourth transistor 9 change inversely thereto between the potential V4 and the potential V3. At time t1' and a time t2' respectively characterize the point in time of the signal transition. The signal B2 at the base of the second transistor 2 and the signal B1 at the base of the transistor 1 behave in the same fashion as the signals B7 and B9, whereby a potential B7 corresponding to the potential V3 and a potential B9 corresponding to the potential V4 appear. The potentials V7 and V8, however, lie so far below the potentials V3 and V4 that a saturation of the third and fourth transistors 7, 9 is avoided.

The signal E9 appearing at the emitter of the fourth transistor 9 has a potential V6 up to time t1 and then rises until potential V5 is reached, this being subsequently retained until time t2'. The signal E7 appearing at the emitter of the third transistor 7 retains the potential V5 until time t1', rises until it reaches twice the difference of the potentials V5 and V6 and then drops until it reaches the potential V6. The threshold of the fourth transistor 9 is reached and this is driven at time t1". A change of potential from a potential V1 to a potential V2 thereby derives for a signal C9 at the collector of the fourth transistor 9. Inversely thereto, the change of the signal V7 appearing at the collector of the third transistor 7 occurs from the potential V2 to the potential V1 since the signal E9 from time t2 through t2" behaves in the same way as the signal E7 between the times t1 and t1". When the potential at the emitter of the third transistor 7 is boosted, the emitter of the fourth transistor 9 is also boosted since the voltage U at the capacitor 4 is initially not changed. The base of the fourth transistor 9 is thereby lowered by the same amount with which the base of the third transistor 7 is boosted. Twice the switching voltage thus derives via the capacitor 4 and this must be compensated for by a doubled charging current I. The time between t1' and t1" yields the delay time Dt. At time t2, the delayed signals B1, B2, B7, B9 return to their original condition. As a result thereof, a signal curve reversed compared to times t1, t1', t1", is triggered at time t2, t2', t2", whereby the delay time Dt is formed by the difference between t2' and t2". The condition $V1 > V2 > V3 > V4 > V5 > V6 > V7 > V8$ derives for the potentials.

The dependency of the delay time Dt on the capacitance C of the capacitor 4 as well as on the voltage U across the capacitor 4 in the steady state condition and on the charging current I of the capacitor 4 can be formerly described by the equation $Dt = C(2U/I)$. By changing the charging current I (this, for example, occurs by varying the current of the first current source 3), the delay time Dt can be influenced in a defined range. When, as shown in FIG. 2 and in FIG. 3, the circuit arrangement in a development of the present invention is charged with an additional drive circuit, then the voltage U at the capacitor 4 and, thus, the delay time Dt as well can be set in linear dependency on the current defined by the sixth current source 25. The advantage is that there is a linear relationship between the controlled variable and the delay time, this being of significance particularly when using a digital-to-analog converter for supplying currents. The basic running time that, among other things, is also dependent on the current of the first current source 3 derives when the current of the sixth current source 25 is equal to zero.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. Integratable circuit arrangement for delaying pulse-shaped signals, comprising:
   collectors of a first and of a second transistor, whose coupled emitters are connected to a zero potential via a first means for current impression, connected to one another with a capacitor;
   the collector of the first transistor connected, first, to the zero potential via a second means for current impression and, second, to an emitter of a third transistor whose collector is connected to a first supply potential via a first resistor;
   the collector of the second transistor connected, first, to the zero potential via a third means for current impression and, second to an emitter of a fourth transistor whose collector is connected to the first supply potential via a second resistor;
   a base of the third transistor being provided as a first, non-inverting input, a base of the fourth transistor being provided as a first, inverting input, a base of the second transistor being provided as a second, non-inverting input, and a base of the first transistor being provided as a second, inverting input;
   the collector of the fourth transistor being provided as a non-inverting output and the collector of the third transistor being provided as an inverting output; and
   differences in potential applied between the two inverting inputs and differences in potential applied between the two non-inverting inputs being dimensioned such that a saturation of the first and second transistors is avoided.

2. Integratable circuit arrangement according to claim 1, wherein the capacitor is divided into two identical sub-capacitors each of which has three plates lying in series; wherein respectively one outer plate of the sub-capacitors is charged with an auxiliary potential; and wherein the two other plates of the one sub-capacitor are cross-connected to the two other plates of the other sub-capacitor forming the terminals of the capacitor.

3. Integratable circuit arrangement according to claim 2, wherein first and second clamp diodes are respectively connected in parallel to the first and second resistors in non-conducting direction.

4. Integratable circuit arrangement according to claim 1, wherein the first and second transistors, the third and fourth transistors, the second and third means for current impression as well as the first and second resistors are each respectively identically constructed.

5. Integratable circuit arrangement for delaying pulse-shaped signals, comprising:
   collectors of a first and of a second transistor, whose coupled emitters are connected to a zero potential via a first means for current impression, connected to one another with a capacitor;
   the collector of the first transistor connected, first, to the zero potential via a second means for current impression and, second, to an emitter of a third transistor whose collector is connected to a first supply potential via a first resistor;
   the collector of the second transistor connected, first, to the zero potential via a third means for current impression and, second to an emitter of a fourth transistor whose collector is connected to the first supply potential via a second resistor;
   the collector of the fourth transistor being provided as a non-inverting output and the collector of the third transistor being provided as an inverting output;
   a base of the third transistor connected to the zero potential via a fourth means for current impression and being connected to the emitter of a fifth transistor whose collector is connected to the first supply potential and whose base is connected to a collector of a seventh transistor that is connected to the first supply potential via a third resistor;
   a base of the fourth transistor connected to the zero potential via a fifth means for current impression and being connected to the emitter of a sixth transistor whose collector is connected to the supply potential and whose base is connected to a collector of an eighth transistor that is connected to the first supply potential via a fourth resistor;
   emitters of the seventh and eighth transistors being coupled and connected to the zero potential via a sixth means for current impression;
   a ninth transistor having its collector connected to the first supply potential and having its base provided as a non-inverting input has its emitter connected to the base of the seventh transistor and connected to a first terminal of a first serial diode pair in a conducting direction, a second terminal of the first serial diode pair connected to the base of the first transistor and connected to the zero potential via a seventh means for current impression; and
   a tenth transistor having its collector connected to the first supply potential and having its base provided as an inverting input has its emitter connected to the base of the eighth transistor and connected to a first terminal of a second serial diode pair in a conducting direction, a second terminal of the second serial diode pair connected to the base of the second transistor and connected to the zero potential via an eighth means for current impression;

differences in potential applied between the two inputs being dimensioned such that a saturation of the first and second transistors is avoided.

6. Integratable circuit arrangement according to claim 5, wherein the fifth and sixth transistors, the seventh and eighth transistors, the ninth and tenth transistors, the fourth and fifth means for current impression, the seventh and eighth means for current impression, as well as the first and second diode pairs are each respectively identically executed; and wherein the third and fourth resistors have the same value of resistance.

7. Integratable circuit arrangement according to claim 5, wherein seven output stages of a seven-stage, first current mirror whose input is connected to a ninth means for current impression are provided as the first, second, third, fourth, fifth, seventh, and eighth means for current impression, respectively; and wherein the current established by the sixth means for current impression is externally adjustable.

8. Integratable circuit arrangement for delaying pulse-shaped signals, comprising:
collectors of a first and of a second transistor, whose coupled emitters are connected to a zero potential via a first means for current impression, connected to one another with a capacitor;
the collector of the first transistor connected, first, to the zero potential via a second means for current impression and, second, to an emitter of a third transistor whose collector is connected to a first supply potential via a first resistor;
the collector of the second transistor connected, first, to the zero potential via a third means for current impression and, second to an emitter of a fourth transistor whose collector is connected to the first supply potential via a second resistor;
a base of the third transistor connected to a collector of a seventh transistor and base of the fourth transistor connected to a collector of an eighth transistor;
the collector of the seventh transistor connected to a second supply potential via a third resistor and the collector of the eighth transistor connected to a second supply potential via a fourth resistor;
emitters of the seventh and eighth transistors being coupled and connected to an external means for current impression;
a ninth transistor having its collector connected to a third supply potential and having its base connected to a first output of a differential amplifier has its emitter connected to the base of the seventh transistor and connected to a first terminal of a first diode in a conducting direction, a second terminal of the first diode connected to the base of the first transistor and connected to the zero potential via a seventh means for current impression; and
a tenth transistor having its collector connected to the third supply potential and having its base connected to a second output of the differential amplifier has its emitter connected to the base of the eighth transistor and connected to a first terminal of a second diode in a conducting direction, a second terminal of the diode connected to the base of the second transistor and connected to the zero potential via an eighth means for current impression;
differences in potential applied between the two inputs being dimensioned such that a saturation of the first and second transistors is avoided.

9. Integratable circuit arrangement according to claim 8, wherein the first supply potential is connected to one side of a further capacitor in parallel with a further diode which is connected in a conducting direction to provide at the other side thereof a third supply potential and wherein a fourth supply potential is connected via a drop resistor to the first supply potential.

10. Integratable circuit arrangement according to claim 8, wherein the seventh and eighth transistors, the ninth and tenth transistors, the eleventh and twelfth transistors, the seventh and eighth means for current impression, the first and second diodes, as well as the third and fourth resistors are each respectively identically executed.

11. Integratable circuit arrangement according to claim 8, wherein three output stages of a three-stage, second current mirror having a reference voltage source generating a first reference potential as an input stage are provided as the first, second and third means for current impression, respectively, and three output stages of a three-stage, third current mirror having a second reference voltage source generating a second reference potential as an input stage are provided as the seventh, eighth and ninth means for current impression, respectively.

12. Integratable circuit arrangement according to claim 7, wherein the first, second and third means for current impression are designed such that the current densities in transistors of the respective output stages are respectively of the same size.

13. Integratable circuit arrangement according to claim 5, wherein a digital-to-analog converter having current output is provided as the sixth means for current impression.

14. Circuit arrangement according to claim 1, wherein signals appearing at the inverting and non-inverting outputs are each respectively conducted via emitter followers.

15. Integratable circuit arrangement according to claim 5, wherein the capacitor is divided into two identical sub-capacitors each of which has three plates lying in series; wherein respectively one outer plate of the sub-capacitors is charged with an auxiliary potential; and wherein the two other plates of the one sub-capacitor are cross-connected to the two other plates of the other sub-capacitor forming the terminals of the capacitor.

16. Integratable circuit arrangement according to claim 15, wherein first and second clamp diodes are respectively connected in parallel to the first and second resistors in non-conducting direction.

17. Integratable circuit arrangement according to claim 5, wherein the first and second transistors, the third and fourth transistors, the second and third means for current impression as well as the first and second resistors are each respectively identically constructed.

18. Integratable circuit arrangement according to claim 8, wherein the external current impression is a sixth current impression connected between the emitter of the seventh and eighth transistors and the zero potential.

19. Integratable circuit arrangement according to claim 8, wherein the capacitor is divided into two identical sub-capacitors each of which has three plates lying in series; wherein respectively one outer plate of the sub-capacitors is charged with an auxiliary potential; and wherein the two other plates of the one sub-capacitor are cross-connected to the two other plates of the other sub-capacitor forming the terminals of the capacitor.

20. Integratable circuit arrangement according to claim 19, wherein first and second clamp diodes are respectively connected in parallel to the first and second resistors in non-conducting direction.

21. Integratable circuit arrangement according to claim 8, wherein the first and second transistors, the third and fourth transistors, the second and third means for current impression as well as the first and second resistors are each respectively identically constructed.

22. Integratable circuit arrangement according to claim 11, wherein the first, second and third means for current impression are designed such that the current densities in transistors of the respective output stages are respectively of the same size.

23. Integratable circuit arrangement according to claim 18, wherein a digital-to-analog converter having current output is provided as the sixth means for current impression.

24. Circuit arrangement according to claim 1, wherein signals appearing at the inverting and non-inverting outputs are each respectively conducted via amplifiers.

25. Circuit arrangement according to claim 5, wherein signals appearing at the inverting and non-inverting outputs are each respectively conducted via emitter followers.

26. Circuit arrangement according to claim 5, wherein signals appearing at the inverting and non-inverting outputs are each respectively conducted via amplifiers.

27. Circuit arrangement according to claim 8, wherein signals appearing at the inverting and non-inverting outputs are each respectively conducted via emitter followers.

28. Circuit arrangement according to claim 8, wherein signals appearing at the inverting and non-inverting outputs are each respectively conducted via amplifiers.

* * * * *

UNITED STATES PATENT AND TRADEMARK OFFICE
CERTIFICATE OF CORRECTION

PATENT NO. : 4,974,916

DATED : December 4, 1990

INVENTOR(S) : Guenter Donig

It is certified that error appears in the above-identified patent and that said Letters Patent is hereby corrected as shown below:

On the Title page, item [73], Assignee should read-- Siemens Aktiengesellschaft, Munich, Fed. Rep. of Germany--

On the Title page, col. 2, under Other Publications, Attorney, Agent, or Firm should read-- Hill, Van Santen, Steadman and Simpson--.

Signed and Sealed this

Thirtieth Day of November, 1993

Attest:

BRUCE LEHMAN

*Attesting Officer*     *Commissioner of Patents and Trademarks*